United States Patent [19]

Bellamy

[11] Patent Number: 4,700,272
[45] Date of Patent: Oct. 13, 1987

[54] APPARATUS AND METHOD FOR COMPENSATION OF THERMAL EXPANSION OF COOLING FLUID IN ENCLOSED ELECTRONIC PACKAGES

[75] Inventor: A. Keith Bellamy, Marlboro, Mass.

[73] Assignee: Digital Equipment Corporation, Maynard, Mass.

[21] Appl. No.: 879,199

[22] Filed: Jun. 26, 1986

[51] Int. Cl.$^4$ .............................................. H05K 7/14
[52] U.S. Cl. .................................... 361/385; 361/395; 174/12 R; 357/82
[58] Field of Search ................ 200/83 C, 83 W, 83 R, 200/83 Z, 81 R, 379; 361/382, 383, 384, 385, 386, 387, 388, 395, 399, 331, 380, 356; 174/12 R; 357/81, 82; 165/80, 104.33

[56] References Cited

U.S. PATENT DOCUMENTS

| | | | |
|---|---|---|---|
| 4,226,491 | 10/1980 | Kazama | 361/399 |
| 4,331,830 | 5/1982 | Conway | 174/12 R |
| 4,399,501 | 8/1983 | Masselin | 361/385 |
| 4,491,981 | 1/1985 | Weller | 361/391 |
| 4,591,950 | 5/1986 | Houpt | 361/399 |

FOREIGN PATENT DOCUMENTS

| | | | |
|---|---|---|---|
| 492332 | 9/1938 | United Kingdom | 174/12 R |
| 635541 | 4/1950 | United Kingdom | 174/12 R |

Primary Examiner—G. P. Tolin
Attorney, Agent, or Firm—William W. Holloway; William C. Cray

[57] ABSTRACT

In an electronic package in which a fluid is encased to provide efficient thermal transfer between electronic components and cooling plate, the thermal expansion of the cooling fluid is compensated for by tubing in the enclosure. The tubing is vented to the atmosphere and as the cooling fluid expands, the tubing is compressed. The tubing is generally coiled within the chamber and can have a kink in the center region, dividing the tubing into two portions. Both portions of the tubing are vented to the external environment. In the preferred embodiment, surgical tubing is employed to compensate for the thermally induced changes in volume.

7 Claims, 4 Drawing Figures

APPARATUS AND METHOD FOR COMPENSATION OF THERMAL EXPANSION OF COOLING FLUID IN ENCLOSED ELECTRONIC PACKAGES

BACKGROUND OF THE INVENTION

1. Field of the Invention

This invention relates generally to packages of electronic components that require cooling and, more particularly, to electronic component packages that are sealed and have a cooling fluid enclosed therein.

2. Description of the Related Art

As the density of electronic elements in electronic components has increased, the removal of heat from the components has become increasingly important to prevent compromise of the operating characteristics of the elements as a result of temperature increase.

In order to remove the heat form the components, it is known to cause a flow of air over the components. However, the use of flowing gas as a cooling medium has been found to be unsatisfactory as the density of elements in the electronic components has increased. To overcome the problems arising because of the relatively low heat capacity of a gas, a flowing liquid has been utilized. The flowing liquid indeed provides a satisfactory cooling of the high density components at the cost of elaborate apparatus for circulating the liquid past the components. The added complexity of the circulation apparatus has limited the application of this technique to expressive data processing systems.

Another method of cooling electronic components having a high electronic element density is by placing a cooling plate, a structure with a high thermal conductivity for conducting heat away from the from the component, in contact with the components, i.e. of a circuit board. The difficulty in matching the contours of the components to the contours of the cooling plate and the problems involved in maintaining good thermal contact though a range of temperatures has limited the usefulness of this cooling technique. However, if the components the cooling plate are not in contact, but a liquid with good thermal conductivity is interposed between the components and the cooling plate, the cooling of the components can be accomplished without the problems associated with other techniques. In addition, practical considerations have caused the cooling fluid to be enclosed. This enclosure has provided an addition source of problems. As the temperature of the cooling fluid is changed, the volume of the cooling fluid can change resulting in unacceptable stresses being developed in the enclosure.

A need has therefore been felt for apparatus and method for compensating for the cooling fluid volume changes while minimizing the additional complexity resulting from the compensation technique.

FEATURES OF THE INVENTION

It is an object of the present invention to provide an improved technique for cooling electronic components enclosed in a package.

It is a feature of the present invention to provide apparatus and method for the compensating for thermally induced changes in the volume of a cooling material in an enclosed package.

It is yet another feature of the present invention to provide, in an enclosed package, a bladder vented to the exterior of the package, that provides compensation for thermally induced volume changes of fluid contained in the enclosed package.

SUMMARY OF THE INVENTION

The aforementioned and other features are obtained, according to the present invention, by providing the enclosed portion of the package containing the heat generating components, with a bladder that includes openings to the outside atmosphere. The bladder requires a small but definite force to reduce the volume of cooling fluid displaced by the bladder. The force exerted on the bladder (prior to heating of the components) by the weight of the a cooling liquid and the position of the bladder results in less force than that required to substantially alter the volume of the bladder. When the interior of the package is heated and the volume of the cooling fluid increases, the volume occupied by the bladder decreases by venting gas to the atmosphere. In the preferred embodiment, the bladder includes a coil of tubing, the tubing being kinked in the center region and the two tubing portions defined by the kink being coiled concentrically. Each portion of the tubing is vented to the outside atmosphere. Surgical tubing has been found to have properties suitable for this application.

These and other features of the present invention will be understood upon reading of the following description along with the drawings.

DESCRIPTION OF THE PREFERRED EMBODIMENT

1. Detailed Description of the Figures

Figure 1:
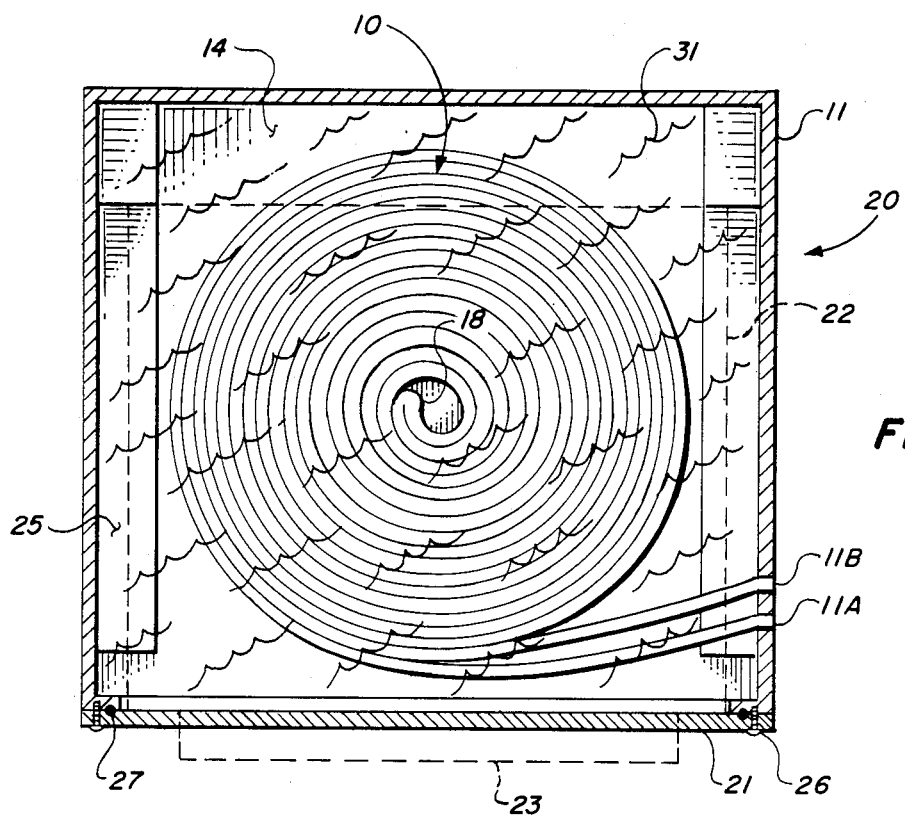
FIG. 1 is a top cross-sectional view of the enclosed package illustrating the configuration of the apparatus compensating for thermally induced changes.

Referring now to FIG. 1, a top cross-sectional view of the package 20 is shown. The side walls 11 and 21 and base plate portion 14 of the package enclose cooling fluid 31, a bladder 10, and a circuit board 22 (shown by dotted lines). In the preferred embodiment, the bladder 10 is actually a length of tubing that is kinked in the center region 18. The kink, 18 divides the tubing 10 in two portions, 10A and 10B. The ends of tubing portion 10A and tubing portion 10B are coupled to outlet ports 11A and 11B. These outlet ports 11A and 11B expose the interior regions of the two tubing portions 10A and 10B to the atmosphere outside of the package.

Figure 2:
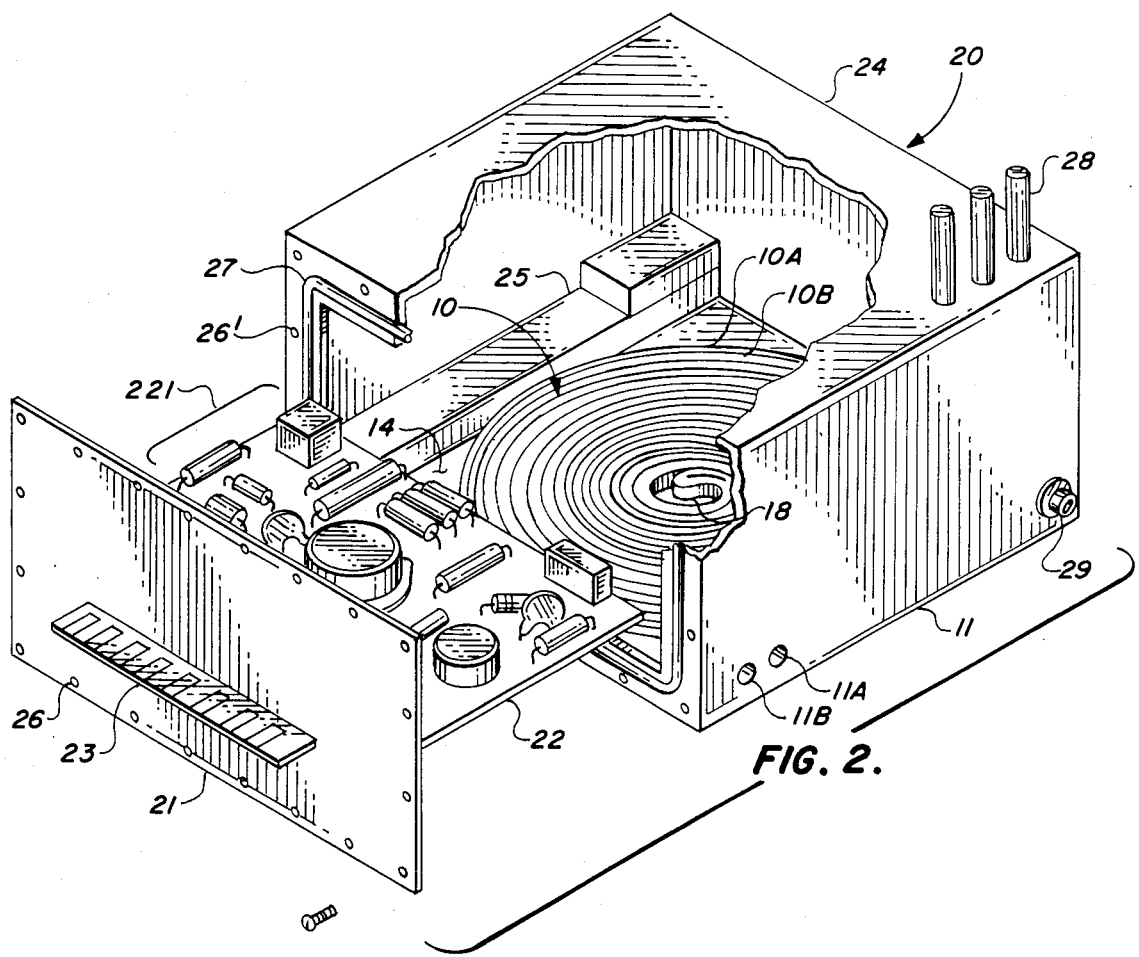
FIG. 2 is a perspective view of the volume compensating apparatus of the present invention used in a electronic component package.

Referring to FIG. 2, a perspective view of the package 20 prior to assembly is illustrated. The package 20 illustrated by FIG. 2 has a cutaway portion to permit a portion of the interior of the package to be visible. The package 20 has a base plate portion 14, side walls 11, a removable side wall 21 and a top (or cooling) plate 24. A circuit board 22 with components 221 has an interface connector 23 coupled thereto. The interface connector 23 of the circuit board extends through the removable wall 21 in such a manner that when the removable wall 21 is coupled to the remainder of the package 20, cooling fluid 31 is enclosed by the package. The circuit board 22 can rest on side members 25 when the package is assembled. An O-ring 27 provides a seal permitting assembly and disassembly of the package while enclosing the cooling fluid when assembled. Fasteners can pass through apertures 26 and can be attached to threaded apertures 26'. The bladder 10 is positioned between the bottom of the circuit board and the interior surface of the base plate 14. The kink 18 in the tubing 10 implementing the bladder in the preferred embodiment divides the tubing into portion 10A and portion 10B, the two tubing portions being coupled to outlet ports 11A and 11B. A fill plug 29 provides the mechanism by which the cooling fluid 31 can be entered into the package 20. The top plate 24 can have heat sinks 28 coupled thereto to dissipate the heat.

Figure 3A:
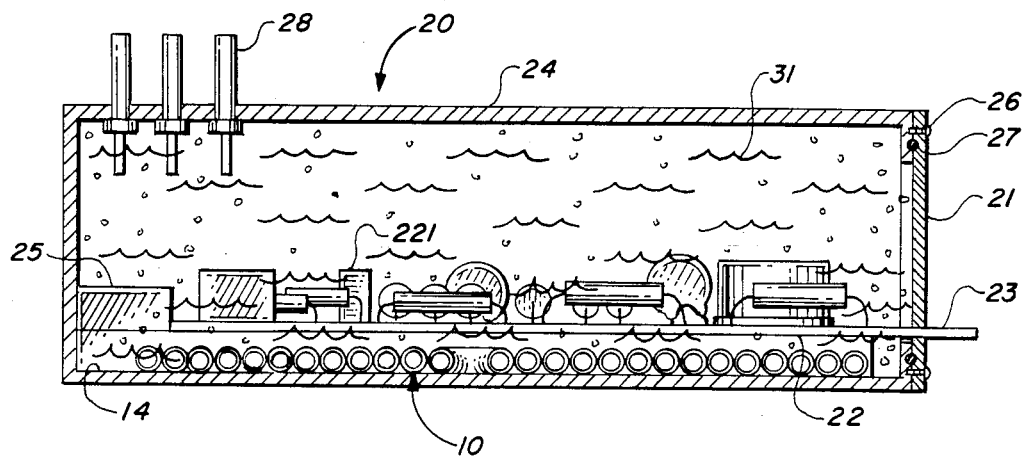
FIG. 3A and FIG. 3B show side cross-sectional views of the enclosed package illustrating the manner in which the bladder compensates for thermal expansion of the cooling fluid.
Figure 3B:
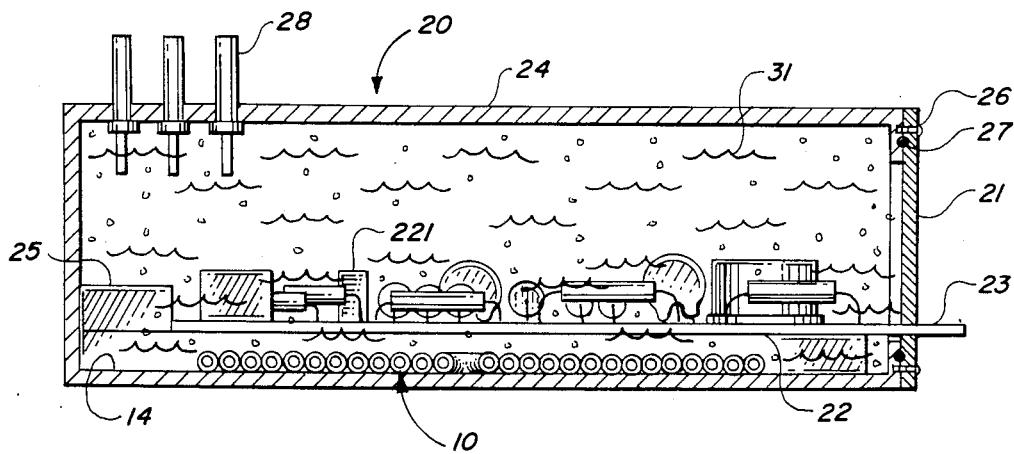

Referring next to FIG. 3A and FIG. 3B, a side cross-sectional view of the package 20 is shown. The circuit board 22 rests on (and can be attached to) shelf 25. The removable side member (or bulkhead) 21 is coupled to the remainder of the package 20 including the cooling plate 24 and the base plate 14. The bladder 10 is positioned between the circuit board 22 and the base plate 14. Cooling fluid 31 is placed within the package in such a manner as to minimize the air bubbles that can compromise the transfer of heat between the circuit board 10 and the cooling plate 24. The cooling fluid is present throughout the interior of the package. Prior to heating of the cooling fluid 31, the bladder 10 occupies a given volume as shown in FIG. 3A. As the components 221 on the circuit board 22 are activated and generate heat, the heat is transferred to the cooling fluid 31. A force is applied to the bladder and and the volume of the bladder decreases as air is forced from the interior of the bladder to the external atmosphere via output ports 11A and 11B as shown in FIG. 3B.

2. Operation of the Preferred Embodiment

The bladder chosen to accommodate the increased volume of cooling fluid within the package must have sufficient resiliency to prevent collapse of the bladder from the weight of the cooling fluid in the package configuration of the preferred embodiment. In the preferred embodiment the bladder is comprised of tubing that is kinked at an intermediate position forming two tubing portions. The two portions are configured into concentric spirals and the interior of each portion is vented to the atmosphere outside of the package.

In the preferred embodiment, surgical tubing is used to provide a satisfactory resiliency for responding to the force exerted by the expanding cooling fluid. The surgical tubing has been found to has an elasticity property the permits expansion and contraction with relatively little change in the pressure applied thereto. In addition, the elasticity of the surgical tubing displays relatively modest fatigue with repeated use. The surgical tubing provides for a relatively easy package design, permits mass productions of the packages and has a relatively low cost. The surgical tubing is relatively easy to seal at the outlet port openings.

It will be clear to those skilled in the art that other package configurations than that illustrated in the Figures can utilize the vented bladder compensation for cooling fluid expansion. Similarly, other orientations of the package can utilize the present invention.

The foregoing description is included to illustrate the operation of the preferred embodiment and is not meant to limit the scope of the invention. The scope of the invention is to be limited only by the following claims. From the foregoing description, many variations will be apparent to those skilled in the art that would yet be encompassed by the spirit and scope of the invention.

What is claimed is:

1. Apparatus including a volume of coolant in an enclosed package with electronic components comprising:
    aperture means formed in a side of said enclosed package; and
    tubing means coupled to said aperture means, said tubing means preventing said coolant from leaving said package through said aperture, said tubing means permitting gas contained within said tubing means to be vented to an external region when said coolant volume increases, wherein said tubing means includes a length of tubing bent at an intermediate region, said bent region causing said tubing means to be divided into two portions, each of said two portions being separately coiled in concentric spirals and separately coupled to said aperture means.

2. The apparatus for compensating for coolant volume changes of claim 1 wherein said coolant volume changes result from generation of heat by said components.

3. The coolant volume compensating apparatus of claim 1 wherein said tubing means is surgical tubing.

4. An electronic package comprising;
    a circuit board having a plurality of components coupled thereto;
    cooling fluid;
    a housing enclosing said circuit board and said cooling fluid, said cooling fluid transferring heat from said components to said housing; and
    a bladder positioned within said housing, said bladder having an interior region coupled to an external environment, wherein a volume occupied by said bladder decreases when a volume of said cooling fluid expands, wherein said bladder is comprised of a length of tubing having a bent region at an interior position of said tubing, said two tubing portions resulting from said bent region being coiled in concentric spirals, each portion being separately coupled to said external environment.

5. The electronic package of claim 4 wherein said bladder is comprised of surgical tubing.

6. The electronic package of claim 4 wherein said coolant volume changes result from changes in heat generated by said components.

7. The electronic package of claim 6 wherein said circuit board has a portion extending outside of said enclosed package, said outside circuit board portion having connector means for coupling said package to external electrical circuits.

* * * * *